(12) United States Patent
Kicin et al.

(10) Patent No.: US 12,293,973 B2
(45) Date of Patent: May 6, 2025

(54) POWER SEMICONDUCTOR MODULE

(71) Applicant: Hitachi Energy Ltd, Zürich (CH)

(72) Inventors: Slavo Kicin, Zürich (CH); Arne Schroeder, Bern (CH); Farhad Yaghoubi, Baden (CH)

(73) Assignee: Hitachi Energy Ltd, Zurich (CH)

( * ) Notice: Subject to any disclaimer, the term of this patent is extended or adjusted under 35 U.S.C. 154(b) by 538 days.

(21) Appl. No.: 17/806,337

(22) Filed: Jun. 10, 2022

(65) Prior Publication Data

US 2022/0399279 A1 Dec. 15, 2022

(30) Foreign Application Priority Data

Jun. 10, 2021 (EP) .................................... 21178802

(51) Int. Cl.
*H01L 23/538* (2006.01)
*H01L 23/64* (2006.01)
*H01L 25/07* (2006.01)

(52) U.S. Cl.
CPC ...... *H01L 23/5386* (2013.01); *H01L 23/5385* (2013.01); *H01L 23/5387* (2013.01); *H01L 23/645* (2013.01); *H01L 25/072* (2013.01)

(58) Field of Classification Search
CPC ............. H01L 23/5386; H01L 23/5385; H01L 23/5387; H01L 25/072; H05K 1/181; H05K 1/189

See application file for complete search history.

(56) References Cited

U.S. PATENT DOCUMENTS

| 6,812,772 | B2 * | 11/2004 | Apeldoorn ....... H03K 17/08124 327/440 |
|---|---|---|---|
| 2007/0297147 | A1 | 12/2007 | Zhuang |
| 2011/0233608 | A1 | 9/2011 | Cottet et al. |
| 2018/0123478 | A1 | 5/2018 | Xu et al. |
| 2020/0185359 | A1 | 6/2020 | Nakashima et al. |
| 2020/0373852 | A1 | 11/2020 | Xu et al. |

FOREIGN PATENT DOCUMENTS

| CN | 110867438 A | 3/2020 |
|---|---|---|
| EP | 3113223 A1 | 1/2017 |
| EP | 3168873 A1 | 5/2017 |
| JP | 2007529115 A | 10/2007 |
| WO | 03065454 A2 | 8/2003 |
| WO | 2017157486 A1 | 9/2017 |

* cited by examiner

*Primary Examiner* — Walter H Swanson
(74) *Attorney, Agent, or Firm* — Slater Matsil, LLP

(57) ABSTRACT

A power semiconductor module includes a plurality of semiconductor switches arranged in a plurality of groups. Each semiconductor switch has a first terminal and a second terminal having a controlled path therebetween and a control terminal. A plurality of first group contacts are each connected to the first terminals of the semiconductor switches of a respective group and a plurality of second group contacts are each connected to the second terminals of the semiconductor switches of the respective group. A plurality of control group contacts are each connected to the control terminals of the semiconductor switches of the respective group. An interconnection bridge connects the control group contacts and the first group contacts of the plurality of groups. The interconnection bridge has a layer structure with a first conductive layer and a second conductive layer being separated by an insulating layer.

20 Claims, 5 Drawing Sheets

POWER SEMICONDUCTOR MODULE

CROSS-REFERENCE TO RELATED APPLICATIONS

This application claims the benefit of European Patent Application No. 21178802.1, filed on Jun. 10, 2021, which application is hereby incorporated herein by reference.

TECHNICAL FIELD

The present disclosure relates to a power semiconductor module.

BACKGROUND

European patent EP 3113223 A1 discloses a power semiconductor module in which several power semiconductor switches are connected together using separate substrate metallizations that are arranged in a stacked manner.

To obtain lower switching losses of a power module, it is an option to use wide-band-gap semiconductors which have in principle a fast switching behavior. However, the use of fast switching semiconductors raises new challenges to the design of modules. Additionally, the area of a typical wide-band-gap semiconductor device is considerably smaller than the area of a silicon device today. Therefore, many more wide-band-gap semiconductor device have to be connected in parallel to achieve targeted current rating.

SUMMARY

The present disclosure relates to a power semiconductor module with a plurality of semiconductor switches arranged in at least two groups, the semiconductor switches having a first terminal and a second terminal of a controlled path and a control terminal.

In one embodiment, a power semiconductor module comprises a plurality of semiconductor switches arranged in a plurality of groups. Each semiconductor switch has a first terminal and a second terminal having a controlled path therebetween and a control terminal. A plurality of first group contacts are each connected to the first terminals of the semiconductor switches of a respective group and a plurality of second group contacts are each connected to the second terminals of the semiconductor switches of the respective group. A plurality of control group contacts are each connected to the control terminals of the semiconductor switches of the respective group. An interconnection bridge connects the control group contacts and the first group contacts of the plurality of groups. The interconnection bridge has a layer structure with a first conductive layer and a second conductive layer being separated by an insulating layer.

Embodiments can provide a power semiconductor module that is based on wide-band-gap semiconductors and comprises many semiconductor switches connected in parallel and which has a fast switching behavior.

Every feature described with respect to one of the aspects is also disclosed herein with respect to the other aspect, even if the respective feature is not explicitly mentioned in the context of the specific aspect.

BRIEF DESCRIPTION OF THE DRAWINGS

The accompanying figures are included to provide a further understanding. In the figures, elements of the same structure and/or functionality may be referenced by the same reference signs. It is to be understood that the embodiments shown in the figures are illustrative for presentations and are not necessarily drawn to scale.

DETAILED DESCRIPTION OF ILLUSTRATIVE EMBODIMENTS

Figure 1:
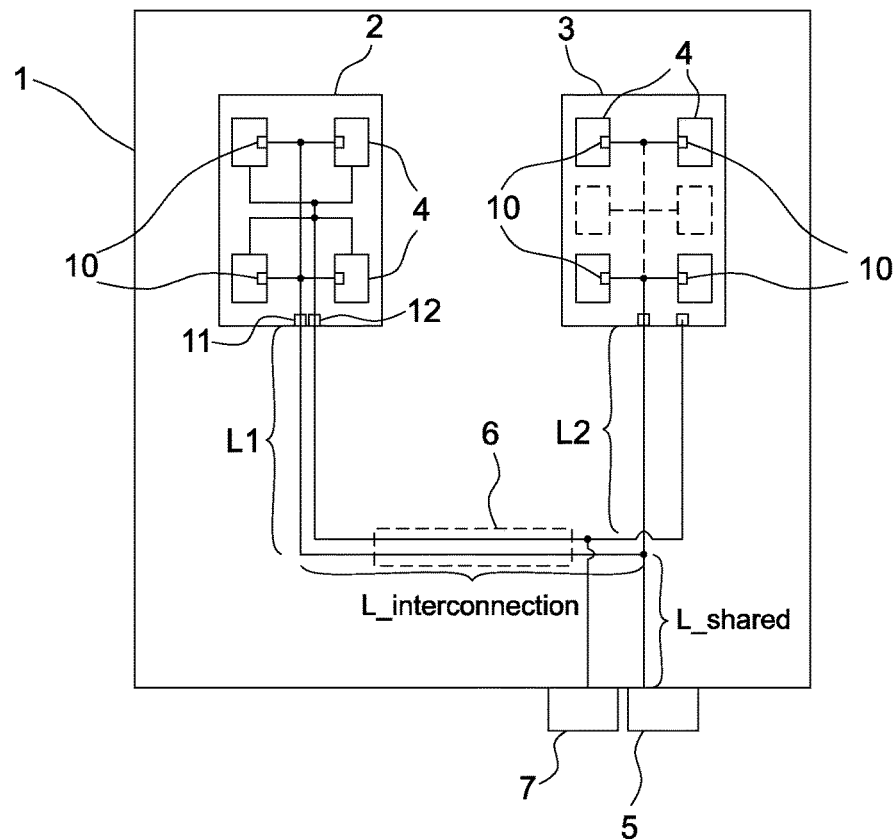
FIG. 1 is a schematic view of a first embodiment of a power module.

According to an embodiment, a power semiconductor module with a plurality of semiconductor switches is arranged in at least two groups. The semiconductor switches have a first terminal and a second terminal of a controlled path and a control terminal. Each group has a first group contact that is connected to the first terminals, a second group contact that is connected to the second terminals and a control group contact that is connected to the control terminals. An interconnection bridge is used for connecting the control group contacts and the first group contacts of the at least two groups. The interconnection bridge comprises a layer structure with a first conductive layer and a second conductive layer being separated by an insulating layer.

Voltage applied between the control group contacts and between the first group contacts is used to control the state of the semiconductor devices, i.e., the voltage effects a switching of states between open and closed. Therefore, fast change of this voltage without critical oscillations is important for low-loss operation. The described embodiments have an improved gate connection. Because of the very close arrangement within the interconnection bridge where both conductive layers are separated only by a very thin insulating layer, a substantial reduction of the gate control loop inductance can be achieved compared to the conventional wire-bond connection between substrates.

The physical reason for the reduced inductance is that for a very close arrangement of two conductors the inductive coupling significantly increases. A current flowing through the gate connection layer of the interconnection bridge to the gate terminals of the switches of that group mainly charges capacities of the gate electrodes. Related currents flow in the other direction through the source connection layer of the interconnection bridge. Due to the anti-parallel direction of the currents and the mutual inductive coupling, a substantial reduction of the gate inductance can be effected.

The proposed embodiment enables that also in power semiconductor modules in which a large number of semiconductor switches are connected in parallel and accordingly the lengths of the connection paths to the different groups of semiconductor switches are very different, the effect of the different lengths on the gate inductances of the different groups of semiconductor switches is attenuated and a better synchronization of the switching behavior and less oscillations can be achieved. This results in an improved switching behavior and less power loss during the switching period.

It is a further advantage of the proposed embodiment that resistors, e.g., gate resistors located directly in the module, which are normally used to attenuate the oscillations between switches can be omitted or at least reduced. This additionally improves the switching behavior. In case that resistors are omitted, a direct connection between a module gate contact and control terminals of the plurality of semiconductor switches can be implemented, which mean that there are no electronic elements in between.

With a sufficient reduction of oscillations, it is at least possible to replace thick film resistors by easily available semiconductor resistors which facilitates production of the module and reduces production costs.

According to a more detailed embodiment the layer structure is formed as a "normal" or flexible printed circuit board. In such an embodiment, both sides of a flexible insulating material are at least partly covered by a conductive material such as a metal. Copper or aluminum or an alloy of copper and aluminum is advantageous as conductive material.

According to another embodiment, the layer structure is formed by a ceramic substrate with a two side metallization. It is advantageous if the interconnection bridge has at least two feet on each side, the feet being connected to group contacts of both groups by soldering or welding or by an adhesive connection. Exemplarily MOSFETs or MISFETs or IGBTs are used as semiconductor switches in the embodiments described. The semiconductor switches may be based on Silicon or a wide bandgap material, exemplarily SiC or GaN.

The present disclosure comprises an additional aspect of improvements of the gate connection, which is selectively increasing the inductance of certain connections within the module. According to this aspect, a compensation structure is provided for shorter gate connection paths. While the total gate inductance is increased by this measure, the differences between the inductances of gate connection paths of different groups within the module can be reduced. This further reduces oscillations and accordingly improves the switching behavior. Compensation structures according to this aspect can be used in combination with the reduction of inductance as described above. This might become necessary or beneficial, because the physical possibilities to reduce the inductance are limited and a complete equalization cannot be achieved in all practical configurations. However, a combination of both aspects, i.e., reduction of the inductance of long connection paths and increase of inductance of short connection paths can lead to complete equalization or at least a substantial reduction of the differences of gate inductances.

FIG. 1 is a schematic view of a power module 1 comprising two groups 2 and 3 of semiconductor switches 4. Gate terminals 10 of semiconductor switches 4 are connected to a module gate contact 5. The length of the conduction paths between the module gate contact 5 and the gate terminals 10 of the semiconductor switches 4 depends on the geometric arrangement of the components within the module 1. For example, if more than two groups of semiconductor switches are provided, it can be difficult to achieve an equal length of the connection paths for each of the groups of semiconductor switches.

The unequal length of the gate connections became a problem because the use of wide-band-gap semiconductors such as silicon carbide, short: SiC, and gallium nitride, short GaN, became more popular to overcome limitations of silicon based power semiconductor devices. Exemplarily, wide bandgap based devices such as silicon carbide and gallium nitride based devices are attractive because of their fast switching capability resulting in low switching losses. However, when using a plurality of wide-band-gap semiconductors in a module, stronger oscillations within the modules were observed. To attenuate such oscillations, resistors were provided in the gate connection path. Often a resistor with 5Ω is sufficient to suppress oscillations. However, for providing such a resistor the use of thick film technology was required which means that an additional production step was necessary. While it is possible this way to suppress oscillations, the initial advantage of wide-band-gap semiconductors which is the fast switching capability cannot be fully maintained.

According to the present disclosure it is not the aim to suppress oscillations but to avoid them from the beginning. The approach is not to minimize the total gate inductance of the power semiconductor module 1, but to equalize the gate inductances of different groups of semiconductor switches. While the switching capability of the power semiconductor module 1 also depends on the total inductance of the gate path, oscillations strongly depend on the difference of inductances and the path lengths of two different groups 2 and 3 of semiconductor switches 4.

In other words, to be able to switch fast, module stray inductance must be sufficiently low to avoid critical voltage overshoots, and inductance imbalance must be low to avoid oscillations between semiconductor switches.

Turning to FIG. 1, the inductance of the gate path of the first group 2 can be described as a shared inductance L_shared+interconnection inductance L_interconnection+inductance L1, while the inductance of the second gate path can be described as shared inductance L_shared+L2. As can be seen from FIG. 1, the connection path to the first group 2 is longer than to the second group 3. According to this embodiment, a part of the gate path to the first group 2 is implemented with an interconnection bridge 6. In connection with a very close sectional parallel arrangement of a source path from a module source contact 7 to the source terminals of switches 4, the inductance of this part of the gate path can be reduced. In practice, a reduction of about 50% of the gate inductance of the gate path to the first group 2 can be achieved.

The proposed features can be beneficial especially in design of complex high-power modules based on many silicon carbide or gallium nitride switches located on several substrates and connected in parallel. However, the concept of this disclosure can be implemented also in smaller power modules as shown in FIG. 1.

It is a typical configuration of a power semiconductor module 1 to connect many semiconductor switches 4 in parallel in order to achieve the intended current density/current rating. This is true e.g. for silicon carbide and gallium nitride semiconductor switches, since the footprint of these switches is smaller compared to switches in Si-technology and accordingly more switches have to be connected in parallel in order to be able to switch a similar current.

Figure 2:
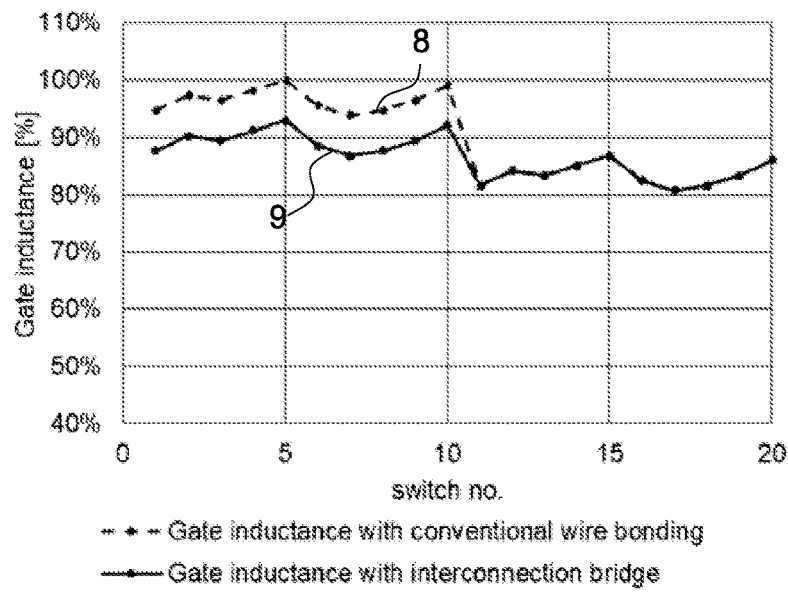
FIG. 2 is a diagram showing the effect of the first embodiment on the gate inductance.

FIG. 2 shows the effect of an interconnection bridge in such an embodiment. For example, it is possible to group 10 semiconductor switches 4 on one substrate of the module and another 10 semiconductor switches 4 on another substrate of the module. 20 semiconductor devices 4 located on both substrates are connected in parallel. In the case of half-bridge module configuration, such two substrates would represent upper or lower side of the module. Another such two substrates, connected in parallel, would form the other switch of this half-bridge module.

In the diagram of FIG. 2 the relative gate inductance in % of the maximum value is drawn for each switch located on any of two substrates connected in parallel. That means switches 1 to 10 belong to the first group 2 and switches 11 to 20 to the second group 3. As can be seen from the dashed line 8 showing the gate inductance for a power semiconductor module with conventional wire bonding, the maximum difference between gate inductances is 19%, while the difference within the group is only 6%. By using the interconnection bridge 6, the inductance of the gate path of the first group 2 is reduced as can be seen from the solid line 9. In an arrangement with interconnection bridge 6, the maximum difference of gate inductances is only 12%.

As further effect, oscillations are reduced and thereby the switching speed can be increased. Measurements of the applicant have shown that the amplitude of oscillations of the gate voltage could be reduced to about 70%. Due to reduced oscillations, the power loss over the switching time could be reduced as well.

Another positive effect of using the idea of this disclosure is that a resistor in the gate path can be at least reduced to a value of less than 2Ω. Such resistors can be implemented as semiconductor resistors and do not require additional production steps.

The disclosure has the advantage that resistors may be omitted to suppress oscillations or at least the implementation as substrate resistor.

Figure 3:
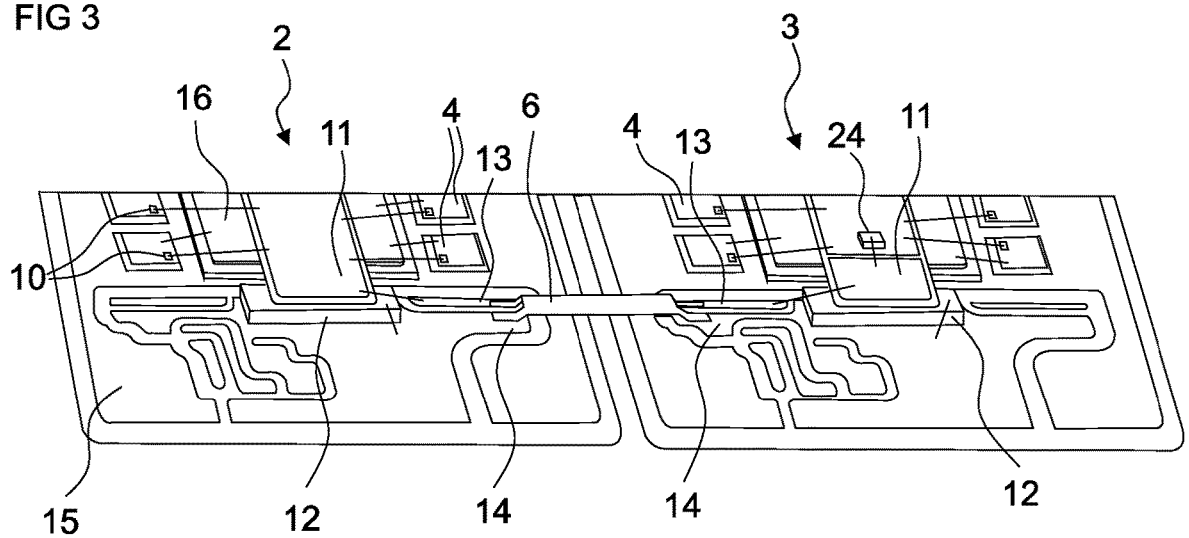
FIG. 3 shows a more concrete view of the first embodiment.

FIG. 3 shows a more detailed view of two groups 2 and 3 of semiconductor switches 4. Semiconductor switches 4 are arranged on a metallization layer. A section 15 of the metallization layer is used as a drain connection. Another section of the metallization layer is separated to form a gate group contact 13, also referenced to as control group contact 13. Further parts of the metallization are separated as source group contact 14 which is also referenced to as first group contact 14. This applies to both substrates of groups 2 and 3.

The gate terminals 10 of switches 4 are connected to a first side metallization 11 which appears in FIG. 3 as top side metallization and from there to the gate group contact 13 as shown for the left group 2. The first side metallization can also be split in for example two parts connected via a resistor 24 and a bond wire as shown for the right group 3. This way the resistor 24 with a value of less than 2Ω is integrated in the gate path to attenuate oscillations.

The source terminals of switches 4 are connected to a further metallization 16 which forms a source interconnection and from there to the first group contact 14. For the connection between the substrates, that means also between the different groups of switches, the interconnection bridge 6 according to this disclosure is used.

Figure 4:
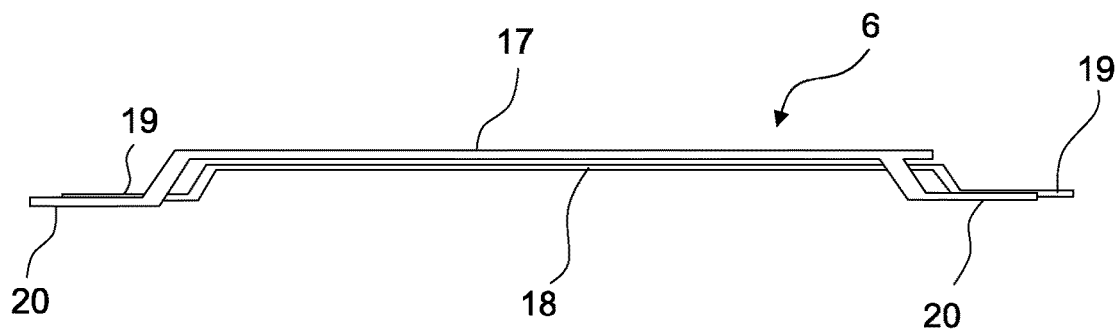
FIG. 4 shows an embodiment of the interconnection bridge.

FIG. 4 shows a more detailed view of the interconnection bridge 6. It comprises two conductive layers 17 and 18. While the layer 18 is used as gate connection, layer 17 is used as source connection. Both layers are separated by an insulating layer which is not shown in this figure. On both sides of the interconnection bridge 6, feet 19 for the gate connection and feet 20 for the source connection are provided. These feet are connected to the control group contacts 13 and the first group contacts 14, for example, by welding or sintering or soldering or an adhesive.

Figure 5:
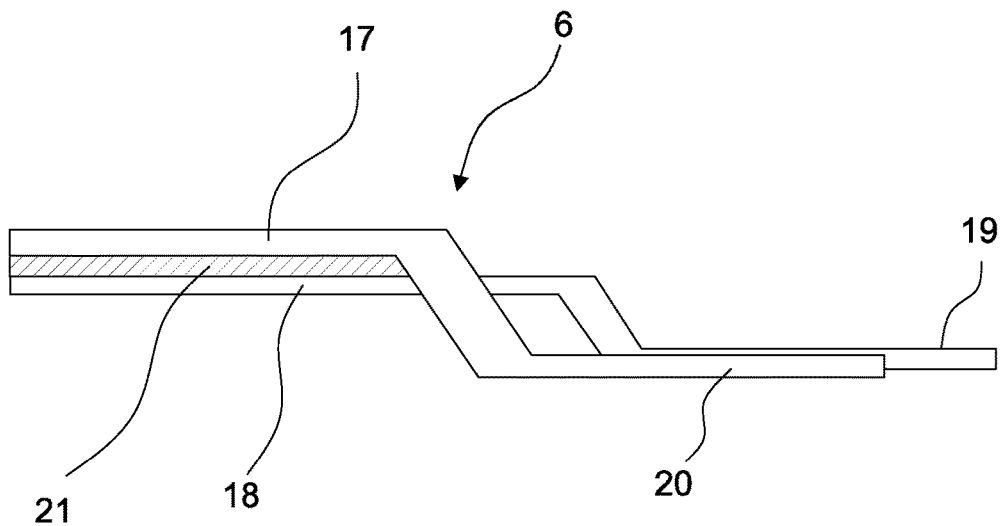
FIG. 5 shows a detail of the view of FIG. 4, FIGS. 6 and 7 show another embodiment of an interconnection bridge with an increased mechanical stability.

FIG. 5 shows an even more detailed view of the interconnection bridge 6. As can be seen from this figure, the conductive layers 17 and 18 are separated by an insulating layer 21. The closer the conductive layers 17 and 18 are, the better the inductive coupling between these conductive layers gets. And the better the coupling is, the lower is the inductance of the gates connection. Therefore, a thin insulating layer is beneficial for the performance of the power semiconductor module. It is beneficial if the thickness of the insulating layer is less than 150 micrometers or even less than 80 micrometers. Realistic are values between 30-150 micrometers.

Figure 6:
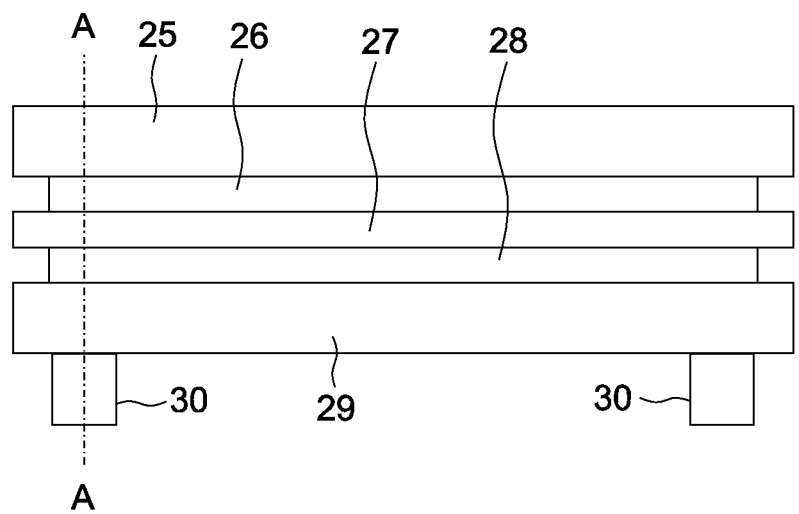
Figure 7:
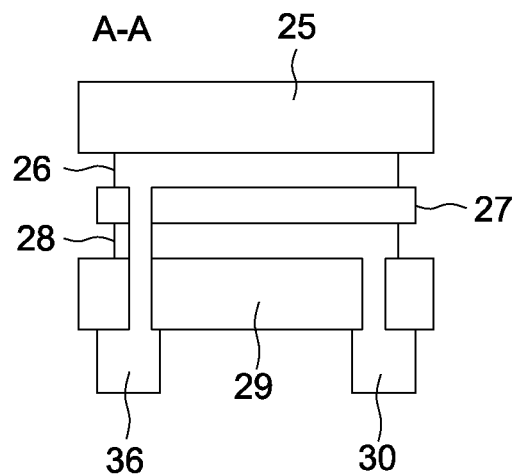

If the low thickness of layers results in unwanted low-mechanical stability of the bridge, an additional layer or layers can be added to increase this mechanical stability. An exemplary embodiment of an interconnection bridge 6 with increased mechanical stability is shown in FIGS. 6 and 7. According to this embodiment, the interconnection bridge comprises a stacked sequence of layers with an insulating and protecting layer 25, followed by a first metallization 26 for a first potential, a thin insulating layer 27, a second metallization 28 for a second potential and a second insulating and protecting layer 29. For example, layers 25 and 26 and also layers 29 and 28 are provided as PCB.

On the other side of the second insulating and protecting layer 29 terminals 30 and 36 are arranged which are used for electrical connection of both metallizations, i.e. the first metallization 26 and the second metallization 28. For that purpose, for example vias can be used to access the metallizations 26 and 28 from the terminal side of the second insulating and protecting layer 29.

FIG. 7 shows a cross-section of the embodiment of FIG. 7. The terminals 30 and 36 for both potentials, which can relate to the gate and source connection, are connected by vias to the first metallization 26 and the second metallization 28, respectively.

Compared to the embodiment of FIGS. 4 and 5, the mechanical stability is increased. This can be beneficial for very long interconnection bridges and additionally opens the possibility to reduce the thickness of the insulating layer to a minimum because it does not have to provide a mechanical function for mechanically stabilizing the interconnection bridge.

Another possibility for mechanically stabilizing the interconnection bridge is to use a glue somewhere between the terminals to support the bridge. This can be implemented for example in connection with all embodiments of this disclosure.

Figure 8:
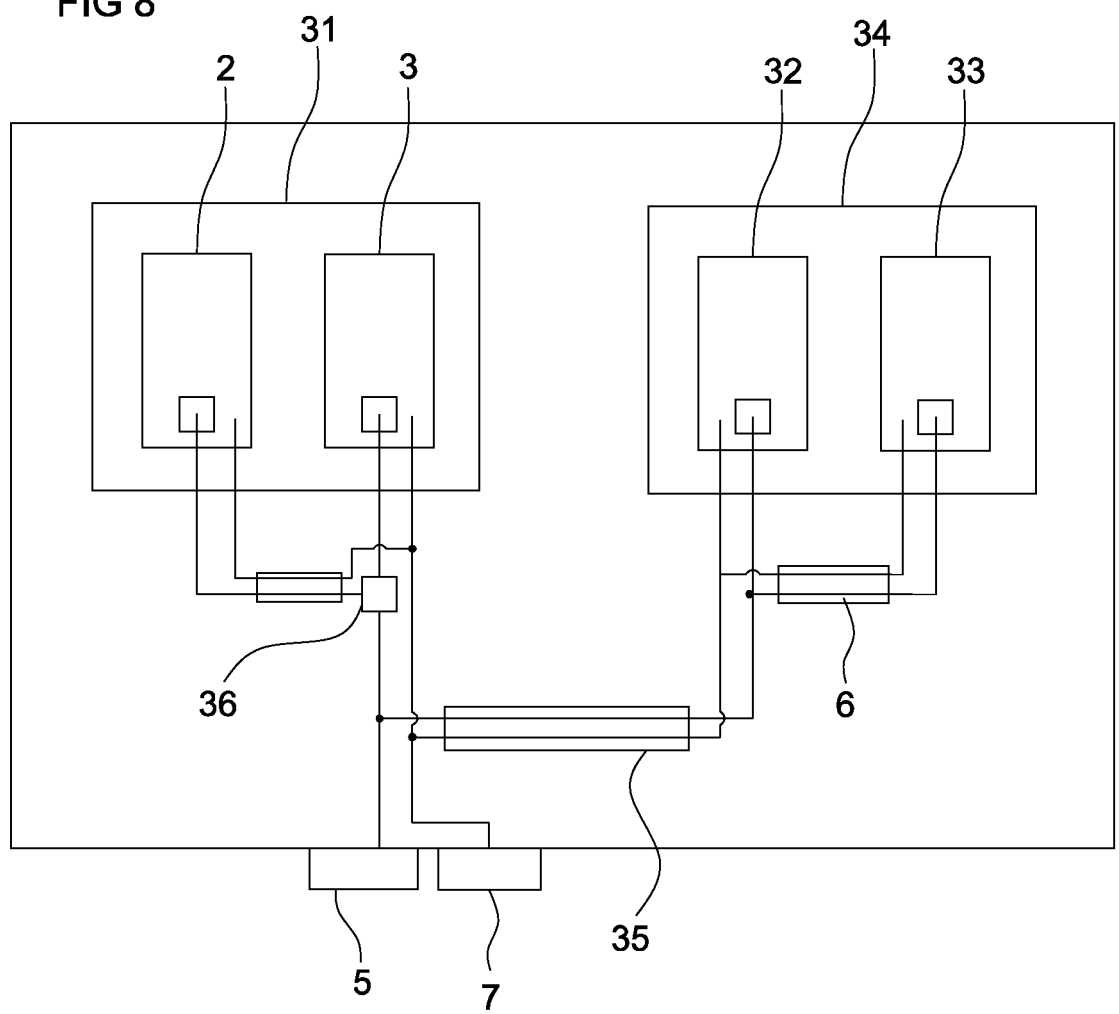
FIG. 8 shows a second embodiment of a power module with an additional compensation structure.

FIG. 8 shows a further embodiment of this disclosure. Here, groups 2 and 3 of semiconductor switches are integrated within a submodule 31. Two additional groups of semiconductor switches 32 and 33 are integrated within a second submodule 34. Each of the submodules 31 and 34 comprises a connection between the groups via an interconnection bridge 6 as described in the previous figures. Also for the gate connection between the first submodule 31 and the second submodule 34 an interconnection bridge 35 is used which is formed similar to the interconnection bridge 6 for the intergroup connection within each submodule 31 and 34. However, according to this embodiment, interconnection bridge 35 cannot fully equalize the differences of gate inductances of the gate paths to submodules 31 and 34. Therefore, an additional compensation structure 36 is provided according to the second aspect of this disclosure as described above. The compensation structure effects an increase of the inductance of the gate connection path to the switches of the first submodule 31. Both, the decrease of inductance by interconnection bridge 35 and increase of inductance by compensation structure 36 contributes to more equal inductances in the gate connection paths of both submodules 31 and 34.

It should be noted that for the technical effect of interconnection bridges 6 and 35, both connection paths for gate and source are required, while for the compensation structure 36 only the gate path has to be modified.

Figure 9:
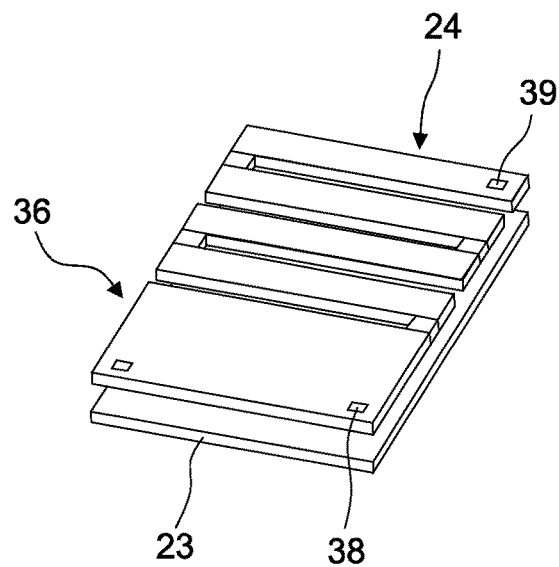
FIGS. 9 to 12 show several design options for a compensation structure.
Figure 10:
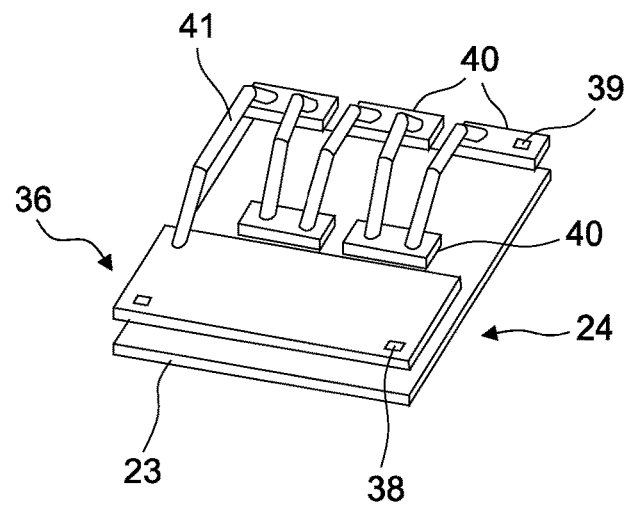

Regarding the implementation of compensation structures, FIGS. 9 to 12 show possibilities which can be easily implemented. FIG. 9 shows a meander like structure in which the connection between contact point 38 and contact point 39 is increased by the meander structure. In FIG. 10, islands 40 are formed in a metallization 22 of a substrate 23 and are connected by bond wires 41. Also this way the current path between connection points 38 and 39 is extended.

Figure 11:
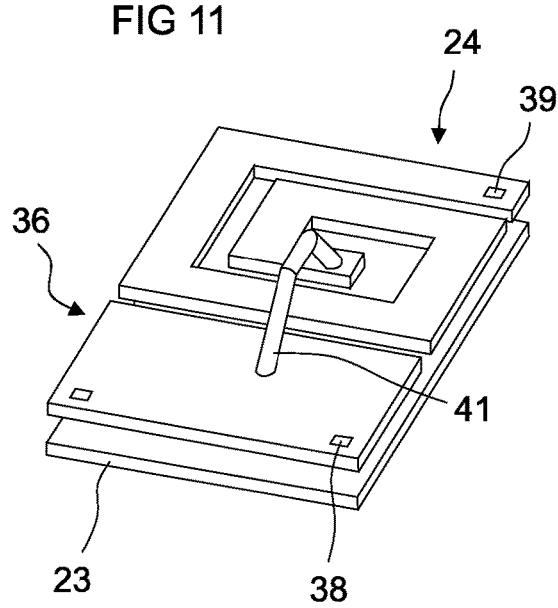

In FIG. 11 a spiral like structure is used for a similar effect.

Figure 12:
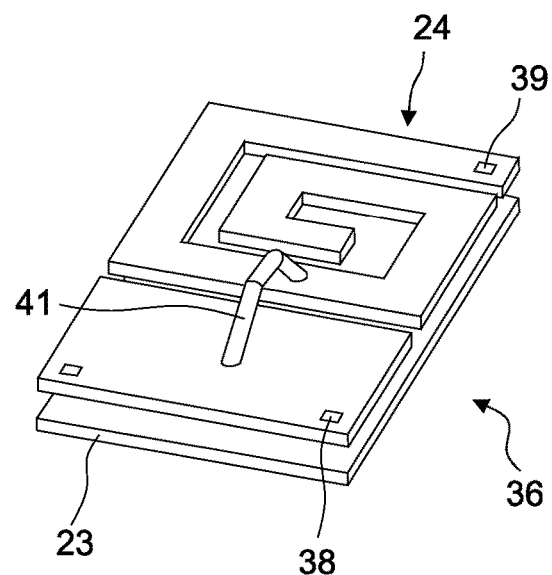

In FIG. 12 the structure of FIG. 11 is used, but the bond wires do not fully use the spiral like structure. This way the configuration structure 36 can be tuned to the specific needs of the individual groups which depend on the geometric arrangement within the power semiconductor module 1.

With regard to the embodiment as shown in FIG. 3, the compensation structure can also be implemented in the metallization 11.

The embodiments shown in FIGS. 1 to 12 as stated represent exemplary embodiments of the improved arrangement of the power semiconductor module. Therefore, they do not constitute a complete list of all embodiments according to the improved arrangement. Actual arrangements may vary from the embodiments shown in terms of arrangements or devices.

What is claimed is:

1. A power semiconductor module comprising:
a plurality of semiconductor switches arranged in a plurality of groups, each semiconductor switch having a first terminal and a second terminal having a controlled path therebetween and a control terminal;
a plurality of first group contacts, each first group contact being connected to the first terminals of the semiconductor switches of that group;
a plurality of second group contacts, each second group contact being connected to the second terminals of the semiconductor switches of that group;
a plurality of control group contacts, each control group contact being connected to the control terminals of the semiconductor switches of that group; and
an interconnection bridge connecting the control group contacts and the first group contacts of the plurality of groups, the interconnection bridge comprising a layer structure with a first conductive layer and a second conductive layer being separated by an insulating layer.

2. The power semiconductor module according to claim 1, wherein the layer structure is formed as a printed circuit board.

3. The power semiconductor module according to claim 2, wherein the layer structure is formed as a flexible printed circuit board.

4. The power semiconductor module according to claim 1, wherein the layer structure comprises a ceramic substrate with a two-side metallization.

5. The power semiconductor module according to claim 1, wherein the interconnection bridge comprises a first plurality of feet at a first end of the interconnection bridge and a second plurality of feet at a second end of the interconnection bridge.

6. The power semiconductor module according to claim 5, wherein each of the feet of the interconnection bridge is connected to an associated group contacts by a soldered connection, a welded connection, a sintered connection, or an adhesive connection.

7. The power semiconductor module according to claim 1, wherein the plurality of semiconductor switches are at least one of MOSFETs or IGBTs based on Si or a wide bandgap material.

8. The power semiconductor module according to claim 1, wherein each of the plurality of semiconductor switches comprises a wide bandgap semiconductor material.

9. The power semiconductor module according to claim 1, further comprising a module control contact that is directly connected to the control terminals of the plurality of semiconductor switches of at least one group.

10. The power semiconductor module according to claim 1, further comprising:
a resistor having a resistance of less than 2Ω; and
a module control contact, the resistor being coupled between the module control contact and the control terminals of the plurality of semiconductor switches of at least one group.

11. The power semiconductor module according to claim 10, wherein the resistor is a semiconductor resistor located on a metallization.

12. The power semiconductor module according to claim 1, wherein a maximum difference in gate inductance within a group is 2 nH.

13. The power semiconductor module according to claim 1, wherein the power semiconductor module is a switch or a half-bridge.

14. The power semiconductor module according to claim 1, wherein the insulating layer has a thickness of less than 150 μm.

15. The power semiconductor module according to claim 14, wherein the insulating layer has a thickness of less than 80 μm.

16. A power semiconductor module comprising:
a first group of semiconductor switches;
a second group of semiconductor switches, each semiconductor switch of the first and second groups having a first terminal and a second terminal having a controlled path therebetween and a control terminal;
a first group contact being connected to the first terminals of the semiconductor switches of the first group;
a second group contact being connected to the first terminals of the semiconductor switches of the second group; a first control group contact being connected to the control terminals of the semiconductor switches of the first group;
a second control group contact being connected to the control terminals of the semiconductor switches of the second group; and
an interconnection bridge connecting the first control group contact to the second control group contact and also connecting the first group contact to the second group contact.

17. The power semiconductor module according to claim 16, further comprising:
a third group of semiconductor switches;
a fourth group of semiconductor switches, each semiconductor switch of the third and fourth groups having a first terminal and a second terminal having a controlled path therebetween and a control terminal;
a third group contact being connected to the first terminals of the semiconductor switches of the third group;

a fourth group contact being connected to the first terminals of the semiconductor switches of the fourth group;
a third control group contact being connected to the control terminals of the semiconductor switches of the third group;
a fourth control group contact being connected to the control terminals of the semiconductor switches of the fourth group;
a second interconnection bridge connecting the third control group contact to the fourth control group contact and also connecting the third group contact to the fourth group contact; and
a third interconnection bridge connecting the interconnection bridge to the second interconnection bridge so that the control terminals of the first and second groups are connected to the control terminals of the third and fourth groups and so that the first terminals of the first and second groups are connected to the first terminals of the third and fourth groups.

18. The power semiconductor module according to claim 16, wherein the interconnection bridge comprises a layer structure with a first conductive layer and a second conductive layer being separated by an insulating layer.

19. The power semiconductor module according to claim 16, further comprising:
a third group contact being connected to the second terminals of the semiconductor switches of the first group; and
a fourth group contact being connected to the second terminals of the semiconductor switches of the second group.

20. A power semiconductor module comprising:
a plurality of semiconductor switches arranged in a plurality of groups, each semiconductor switch comprising a wide bandgap semiconductor material and having a first terminal and a second terminal having a controlled path therebetween and a control terminal;
a plurality of first group contacts, each first group contact being connected to the first terminals of the semiconductor switches of that group;
a plurality of second group contacts, each second group contact being connected to the second terminals of the semiconductor switches of that group;
a plurality of control group contacts, each control group contact being connected to the control terminals of the semiconductor switches of that group;
a module first terminal contact connected to the plurality of first group contacts;
a module control contact connected to the plurality of control group contacts;
a resistor connected between the module control contact and at least one of the control group contacts, the resistor having a resistance of less than 2Ω; and
an interconnection bridge connecting the control group contacts and the first group contacts of the plurality of groups, the interconnection bridge comprising a layer structure with a first conductive layer and a second conductive layer being separated by an insulating layer.

* * * * *